United States Patent
Ookubo (10) Patent No.: US 11,940,595 B2
(45) Date of Patent: Mar. 26, 2024

(54) METHOD FOR PRODUCING OPTICAL MEMBER AND OPTICAL MEMBER

(71) Applicant: HOYA LENS THAILAND LTD., Pathumthani (TH)

(72) Inventor: Shigeki Ookubo, Tokyo (JP)

(73) Assignee: HOYA LENS THAILAND LTD., Pathumthani (TH)

( * ) Notice: Subject to any disclaimer, the term of this patent is extended or adjusted under 35 U.S.C. 154(b) by 165 days.

(21) Appl. No.: 17/343,205

(22) Filed: Jun. 9, 2021

(65) Prior Publication Data

US 2021/0405264 A1   Dec. 30, 2021

(30) Foreign Application Priority Data

Jun. 25, 2020 (JP) ................................ 2020-109830

(51) Int. Cl.
  *G02B 1/115* (2015.01)
  *C23C 14/58* (2006.01)
  *G02C 7/02* (2006.01)

(52) U.S. Cl.
  CPC .......... *G02B 1/115* (2013.01); *C23C 14/5813* (2013.01); *G02C 7/021* (2013.01)

(58) Field of Classification Search
  CPC ...... G02B 1/115; C23C 14/5813; G02C 7/021
  USPC .................................... 351/159.01
  See application file for complete search history.

(56) References Cited

U.S. PATENT DOCUMENTS

| 9,122,073 | B2 * | 9/2015 | Macionczyk | .......... G02C 7/021 |
| 2004/0032566 | A1 | 2/2004 | Nakada et al. | |
| 2016/0169531 | A1 | 6/2016 | Wagner et al. | |
| 2016/0207249 | A1 * | 7/2016 | Maurice | ................ B23K 26/355 |
| 2019/0171034 | A1 * | 6/2019 | Maurice | ................... G02B 1/111 |
| 2019/0171039 | A1 * | 6/2019 | Ding | ....................... G02B 1/115 |
| 2019/0258836 | A1 * | 8/2019 | Maurice | ................. G02C 7/021 |
| 2020/0225512 | A1 * | 7/2020 | Maurice | ........... B29D 11/00951 |

FOREIGN PATENT DOCUMENTS

| JP | 2003-084243 A | 3/2003 |
| JP | 2003-156667 A | 5/2003 |
| JP | 2003-270592 A | 9/2003 |
| JP | 2019-523447 A | 8/2019 |

OTHER PUBLICATIONS

Paulius Gecys, "Ultrashort Pulsed Laser Processing of Thin-Films for Solar Cells", Doctoral Dissertation, Technological Sciences, Material Engineering, pp. 13, 72; table 6, Jan. 2, 2012.

* cited by examiner

*Primary Examiner* — William R Alexander
*Assistant Examiner* — Sharrief I Broome
(74) *Attorney, Agent, or Firm* — Oliff PLC (57) ABSTRACT

A method is provided for producing an optical member. The method includes removing a portion of a low refractive index layer, which is the outermost layer of a multilayer structure in which the low refractive index layer and a high refractive index layer are layered on each other. Non-heating processing is performed on an antireflection film that is formed to cover an optical surface of an optical base member and has the multilayer structure, through irradiation with an ultrashort pulse laser beam, so as to expose the high refractive index layer.

21 Claims, 5 Drawing Sheets

Portion A    Portion B

METHOD FOR PRODUCING OPTICAL MEMBER AND OPTICAL MEMBER

BACKGROUND OF THE INVENTION

1. Field of the Invention

The present invention relates to a method for producing an optical member and an optical member.

2. Description of Related Art

There are cases where eyeglass lenses are formed by covering optical surfaces of lens base members with thin films such as a hard coating film and an antireflection film. In recent years, marking an eyeglass lens by partially removing at least one layer of a thin film by irradiating the thin film with a laser beam has been proposed (see JP 2019-523447A, for example).

JP 2019-523447A is an example of related art.

SUMMARY OF THE INVENTION

With conventional marking process through laser irradiation, there is a risk that a thin film may be separated due to partial removal of at least one layer of the thin film, and a portion of a layer below the removed layer may be damaged. Therefore, if conventional marking process is applied to eyeglass lens products, there is a concern that the quality thereof may deteriorate.

It is an object of this disclosure to provide a technique for marking an optical member without reducing the quality of the optical member.

A first aspect of the present invention is directed to a method for producing an optical member, including:

a removing step of partially removing a low refractive index layer, which is the outermost layer of a multilayer structure in which the low refractive index layer and a high refractive index layer are layered on each other, by performing non-heating processing on an antireflection film that is formed to cover an optical surface of an optical base member and has the multilayer structure, through irradiation with an ultrashort pulse laser beam so as to expose the high refractive index layer.

A second aspect of the present invention is directed to the method for producing an optical member according to the first aspect, in which the ultrashort pulse laser beam has a pulse width of 0.1 picoseconds or more and less than 100 picoseconds.

A third aspect of the present invention is directed to the method for producing an optical member according to the first or second aspect, in which the antireflection film is irradiated with the ultrashort pulse laser beam under a defocus setting.

A fourth aspect of the present invention is directed to the method for producing an optical member according to any one of the first to third aspects, in which the outermost layer is a $SiO_2$ layer serving as the low refractive index layer, and a layer that is exposed through removal of the low refractive index layer is a $ZrO_2$ layer serving as the high refractive index layer.

A fifth aspect of the present invention is directed to the method for producing an optical member according to any one of the first to fourth aspects, in which the optical member is an eyeglass lens.

A sixth aspect of the present invention is directed to the method for producing an optical member according to any one of the first to fifth aspects, in which, in the removing step, a decorative pattern of the optical member is formed by partially removing the low refractive index layer of the outermost layer.

A seventh aspect of the present invention is directed to an optical member including:

an optical base member having an optical surface; and an antireflection film covering the optical surface of the optical base member;

in which the antireflection film has a multilayer structure in which a low refractive index layer and a high refractive index layer are layered on each other, and is formed such that the high refractive index layer is exposed as a result of the low refractive index layer of the outermost layer in the multilayer structure being partially removed.

An eighth aspect of the present invention is directed to the optical member according to the seventh aspect, in which, in the high refractive index layer that is exposed through removal of the low refractive index layer, a ratio t1/t2 between a thickness t1 of a removed portion of the low refractive index layer and a thickness t2 of a non-removed portion of the outermost layer belongs to a range of 0.90 or more and 1.00 or less.

A ninth aspect of the present invention is directed to the optical member according to the seventh or eighth aspect, in which the outermost layer is a $SiO_2$ layer serving as the low refractive index layer, and a layer that is exposed through removal of the low refractive index layer is a $ZrO_2$ layer serving as the high refractive index layer.

A tenth aspect of the present invention is directed to the optical member according to any one of the seventh to ninth aspects, in which the optical member is an eyeglass lens.

An eleventh aspect of the present invention is directed to the optical member according to any one of the seventh to tenth aspects, in which a removed portion of the low refractive index layer of the outermost layer constitutes a decorative pattern of the optical member.

According to the present invention, it is possible to mark an optical member without reducing the quality of the optical member.

DETAILED DESCRIPTION OF THE INVENTION

The following describes an embodiment of the present invention based on the drawings.

In this embodiment, an example in which an optical member is an eyeglass lens will be described below.

The eyeglass lens has an object-side surface and an eyeball-side surface as optical surfaces. The "object-side surface" is the surface that is located on the object side when a wearer wears the glasses including the eyeglass lens. The "eyeball-side surface" is the surface that is located on the opposite side, that is, the eyeball side, when the wearer wears the glasses including the eyeglass lens. Normally, the object-side surface is a convex surface, and the eyeball-side surface is a concave surface, that is, the eyeglass lens is a meniscus lens.

Figure 1:
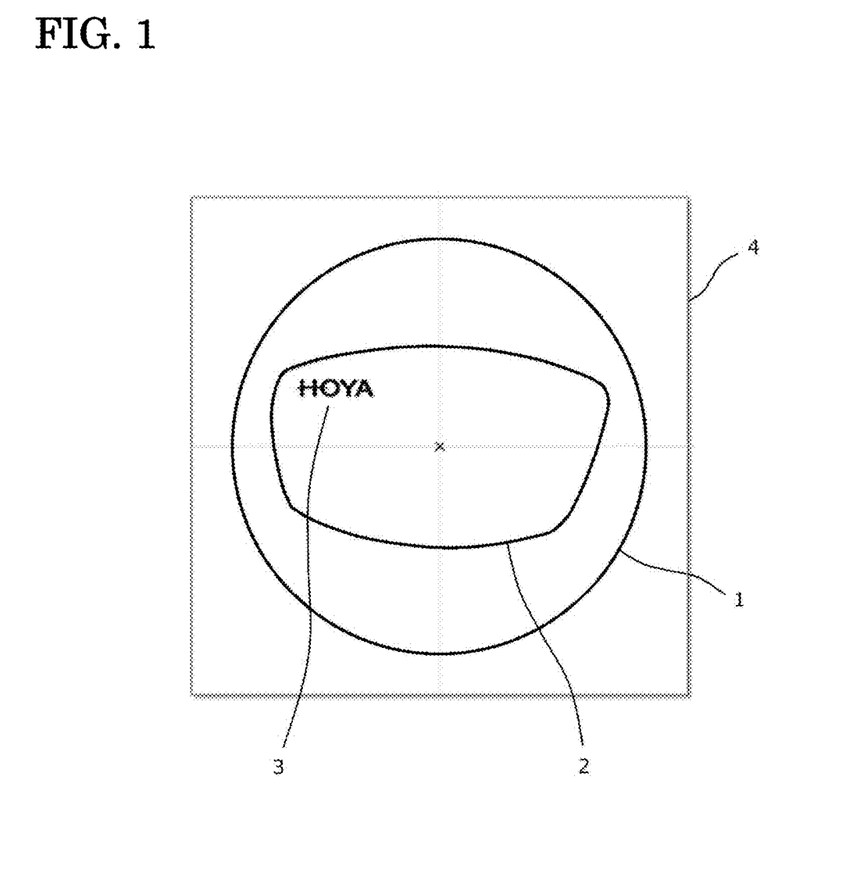
FIG. 1 is a plan view showing an example of a processed eyeglass lens according to an embodiment of the present invention.

FIG. 1 is a plan view showing an example of a processed eyeglass lens according to an embodiment of the present invention.

In this embodiment, lens shaping (frame cutting) for grinding the outer shape of an eyeglass lens 1 having a circular shape in a plan view (e.g., with an outer diameter of ⌀60 to 80 mm) to coincide with a frame shape 2 of the frame of the eyeglass worn by a wearer is performed on the eyeglass lens 1, and an optical surface is marked with a decorative pattern 3 representing a logo, a company logo, or the like such that the decorative pattern 3 is located within the area of the lens that has been subjected to frame cutting.

Although it is conceivable to mark the decorative pattern 3 thereon using laser irradiation processing by which an irradiation position can be precisely controlled based on digital data, for example, it is preferable to not cause degradation of the lens quality due to marking. In view of this, in this embodiment, the decorative pattern 3 is marked using a processing procedure described below.

(1) Method for Producing Eyeglass Lens

Here, a procedure for processing an eyeglass lens including marking of a decorative pattern, that is, a procedure of a method for producing an eyeglass lens according to this embodiment, will be described in detail.

Figure 2:
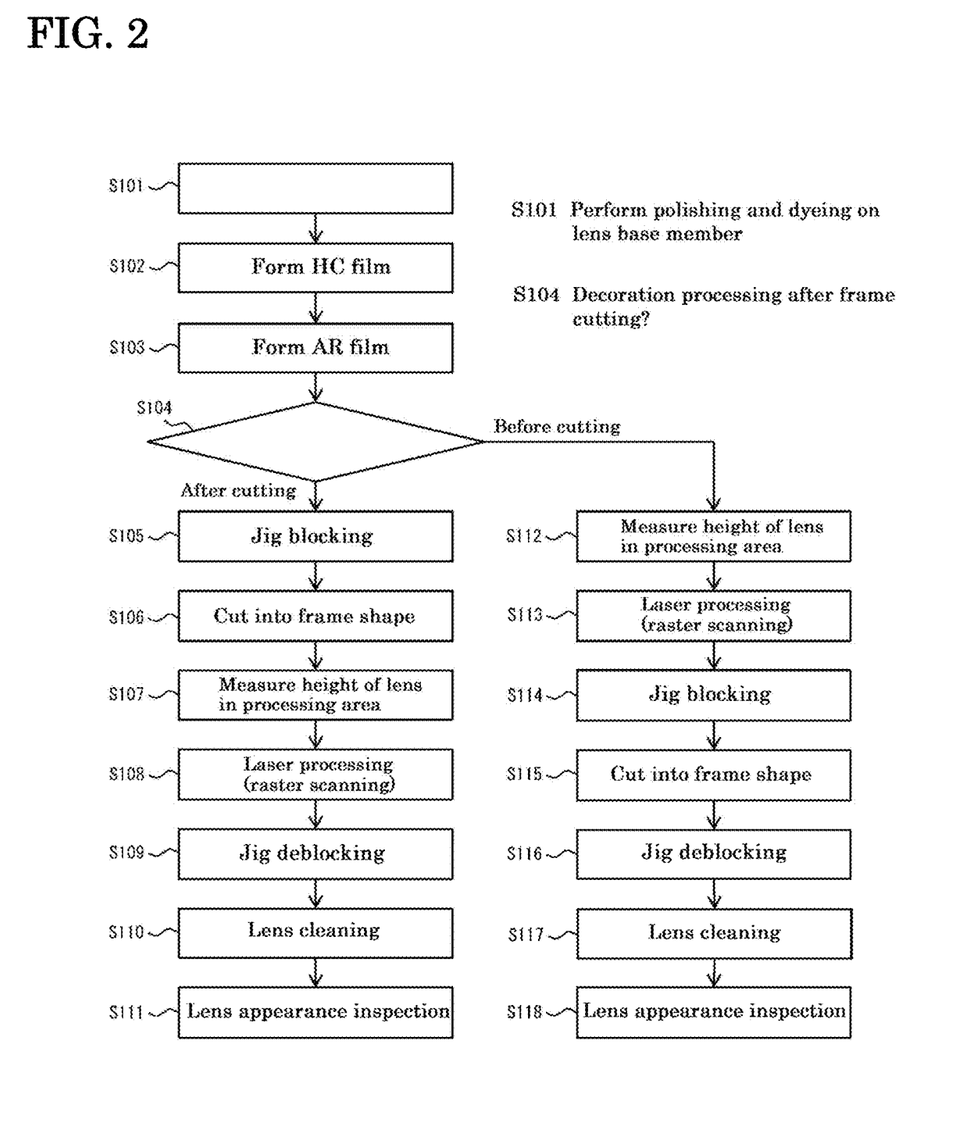
FIG. 2 is a flowchart showing an example of a procedure of a method for producing an eyeglass lens according to an embodiment of the present invention.

FIG. 2 is a flowchart showing an example of the procedure of the method for producing an eyeglass lens according to this embodiment.

When an eyeglass lens is produced, first, a lens base member, which is an optical base member, is prepared, polishing is performed on the lens base member according to information regarding the prescription of the wearer of the eyeglasses, and dyeing is performed thereon as needed (step 101; step will be abbreviated as "S" hereinafter).

A resin material having a refractive index (nD) of about 1.50 to 1.74 is used for a lens base member, for example. Specifically, examples of the resin material include allyl diglycol carbonate, urethane-based resins, polycarbonates, thiourethane-based resins, and episulfide resins. However, the lens base member may be composed of another resin material with which a desired refractivity can be obtained, instead of these resin materials, or may be composed of inorganic glass. Also, the lens base member may have optical surfaces for constituting a predetermined lens shape respectively on the object-side surface and the eyeball-side surface. A predetermined lens shape may constitute any one of a single-focus lens, a multifocal lens, and a progressive refractive power lens, and the like, and each optical surface is constituted by a curved surface specified based on information regarding the prescription of the wearer of the eyeglasses in any case. The optical surfaces are formed through polishing, for example, and may be a cast (molded) product that does not require polishing.

Note that polishing and dyeing to be performed on a lens base member need only be performed using a known technique, and a detailed description thereof is omitted here.

Thereafter, a hard coating film (HC film) is formed on at least one optical surface of the lens base member, and is preferably formed on both optical surfaces thereof (S102).

The HC film is formed of a curable material containing a silicon compound, and is a film formed with a thickness of about 3 μm to 4 μm, for example. The refractive index (nD) of the HC film is close to the refractive index of the above-described material of the lens base member, and ranges from about 1.49 to 1.74, for example, and the film composition is selected according to the material of the lens base member. The durability of an eyeglass lens can be improved by covering the lens base member with such an HC film.

The HC film may be formed using a dipping method in which a solution is used in which a curable material containing a silicon compound is dissolved, for example.

After the HC film is formed, an antireflection film (AR film) is then formed so as to be layered on the HC film (S103).

The AR film is a film that has a multilayer structure in which films with different refractive indexes are layered on each other, and prevents light reflection using interference effects. Specifically, the AR film is formed so as to have a multilayer structure in which a low refractive index layer and a high refractive index layer are layered. The low refractive index layer is composed of silicon dioxide ($SiO_2$) having a refractive index of about 1.43 to 1.47, for example. Also, the high refractive index layer is made of a material having a higher refractive index than that of the lower refractive index layer, and is composed of zirconium oxide ($ZrO_2$), tin oxide ($SnO_2$), niobium oxide ($Nb_2O_5$), tantalum oxide ($Ta_2O_3$), titanium oxide ($TiO_2$), yttrium oxide ($Y_2O_3$), aluminum oxide ($Al_2O_3$), a mixture thereof (e.g., indium tin oxide (ITO)), and the like, for example. However, it is preferable that the outermost layer of the AR film with a multilayer structure is always formed to be a low refractive index layer (e.g., a $SiO_2$ layer). The visibility of an image seen through an eyeglass lens can be improved by covering the eyeglass lens with such an AR film.

The AR film may be formed through ion-assisted deposition, for example.

A water repellent film may be formed on the low refractive index layer, which is the outermost layer of the AR film.

The water repellent film is a film that imparts water repellency to the surface of the AR film, and can be formed by applying a solution containing a fluorine-based compound such as m-xylene hexafluoride, for example.

The water repellent film may be formed through ion-assisted deposition in the same manner as in the case where the AR film is formed, for example.

Figure 3:
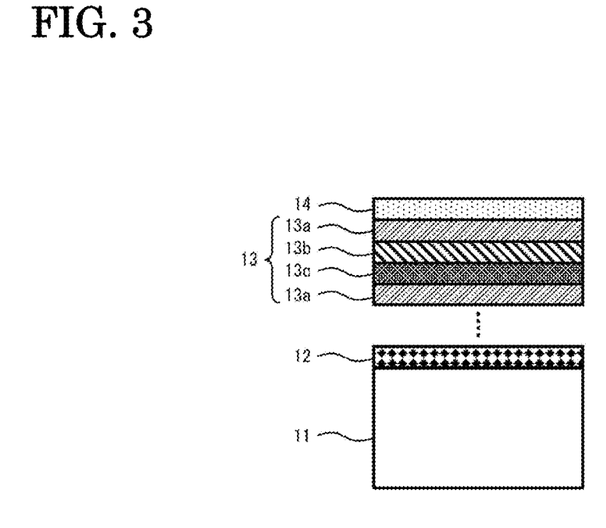
FIG. 3 is a side cross-sectional view showing an example of a layered structure of thin films on an eyeglass lens according to an embodiment of the present invention.

Thin films with a layered structure shown in FIG. 3 are formed on an optical surface of a lens base member through film formation processing as described above.

FIG. 3 is a side cross-sectional view showing an example of a layered structure of thin films according to this embodiment.

The layered structure in the example shown in FIG. 3 is formed by layering an HC film 12, an AR film 13, and a water repellent film 14 on an optical surface of a lens base member 11 in the stated order. Also, the AR film 13 has a multilayer structure in which a $SiO_2$ layer 13a, which is a low refractive index layer, and a $SnO_2$ layer 13b and a $ZrO_2$ layer 13c, which are high refractive index layers, are layered, and the outermost layer (i.e., a surface layer on the water repellent film 14 side) is formed to serve as the $SiO_2$ layer 13a.

After the thin films are formed, as shown in FIG. 2, frame cutting is performed on and a decorative pattern is marked on the eyeglass lens provided with the thin films. If decoration processing is to be performed after frame cutting (S104: after cutting), for example, first, jig blocking is performed to mount one optical surface (specifically, an optical surface on which decoration processing, which will be described later, is not to be performed) of an eyeglass lens to be processed to a dedicated jig (S105). Then, the blocked eyeglass lens is set in a lens shaping machine, lens shaping (frame cutting) is performed on the eyeglass lens, and the outer shape of the eyeglass lens is cut into a frame shape (S106). It is sufficient that jig blocking and frame cutting are performed using known techniques, and thus a detailed description thereof is omitted here.

After frame cutting, decoration processing is performed (i.e., marking of a decorative pattern is performed). When decoration processing is performed, first, with regard to a processing target surface of the eyeglass lens to be processed (specifically, an optical surface on the unblocked side), the height of the lens in the processing area (i.e., a three-dimensional shape of the processing area on the processing target surface) is measured in a blocked state (S107). Although there is no particular limitation on the measuring method, it is conceivable to use a noncontact three-dimensional measuring machine, for example.

After the lens height in the processing area is measured, laser processing in which the processing area is irradiated with a laser beam is performed, and raster scanning is performed in which a laser irradiation position is moved based on pre-prepared pattern data (S108). Vector scanning may be performed instead of raster scanning. Accordingly, a decorative pattern is marked on the processing area of the processing target surface of the eyeglass lens. Note that laser processing for marking a decorative pattern will be described later in detail.

After the decorative pattern is marked, jig deblocking is performed to remove the eyeglass lens from the dedicated jig (S109), and lens cleaning for removing residue and deposits (foreign matter) generated during marking is performed on the removed eyeglass lens (S110). Then, the production of the eyeglass lens is completed with a final lens appearance inspection (S111).

On the other hand, if frame cutting is to be performed after decoration processing (S104: before cutting), with regard to the processing target surface of the eyeglass lens to be processed, the lens height in the processing area (i.e., the three-dimensional shape of the processing area on the processing target surface) is first measured (S112). The measuring method is similar to that in the above-described case where decoration processing is performed after frame cutting.

After the lens height in the processing area is measured, laser processing in which the processing area is irradiated with a laser beam is performed, and raster scanning is performed in which a laser irradiation position is moved based on pre-prepared pattern data (S113). Vector scanning may be performed instead of raster scanning. Accordingly, a decorative pattern is marked on the processing area of the processing target surface of the eyeglass lens. Note that laser processing for marking a decorative pattern will be described later in detail.

After the decorative pattern is marked, frame cutting is then performed on the marked eyeglass lens. When frame cutting is performed, first, jig blocking is performed to mount one optical surface of the eyeglass lens to be processed to a dedicated jig (S114), the blocked eyeglass lens is set in a lens shaping machine, lens shaping (frame cutting) is performed on the eyeglass lens, and the outer shape of the eyeglass lens is cut into a frame shape (S115). After frame cutting, jig deblocking is performed to remove the eyeglass lens from the dedicated jig (S116), and lens cleaning for removing residue and deposits (foreign matter) generated during marking is performed on the removed eyeglass lens (S117). Then, the production of the eyeglass lens is completed with a final lens appearance inspection (S118).

(2) Details of Laser Processing

Next, laser processing performed to mark a decorative pattern will be described in more detail.

In this embodiment, a decorative pattern is marked by partially removing the $SiO_2$ layer 13a, which is the outermost layer of the AR film 13, by irradiating the AR film 13 covering an optical surface of the lens base member 11 with a laser beam. That is, the decorative pattern is marked thereon through a removing step in which a high refractive index layer on the lower layer side of the $SiO_2$ layer 13a, which is the outermost layer, is exposed by partially removing the $SiO_2$ layer 13a through laser processing in which laser irradiation is performed. The high refractive index layer to be exposed is the $ZrO_2$ layer 13c, for example. The $SnO_2$ layer 13b, which is a high refractive index layer on the upper layer side of the $ZrO_2$ layer 13c, may be removed together with the $SiO_2$ layer 13a, which is the outermost layer, as long as the $ZrO_2$ layer 13c serving as a high refractive index layer is exposed. If the removal of the $SnO_2$ layer 13b is allowed, the $SnO_2$ layer 13b can be formed to have a small thickness (e.g., about 5 nm).

Here, a laser processing apparatus used in laser processing will be described briefly.

Figure 4A:
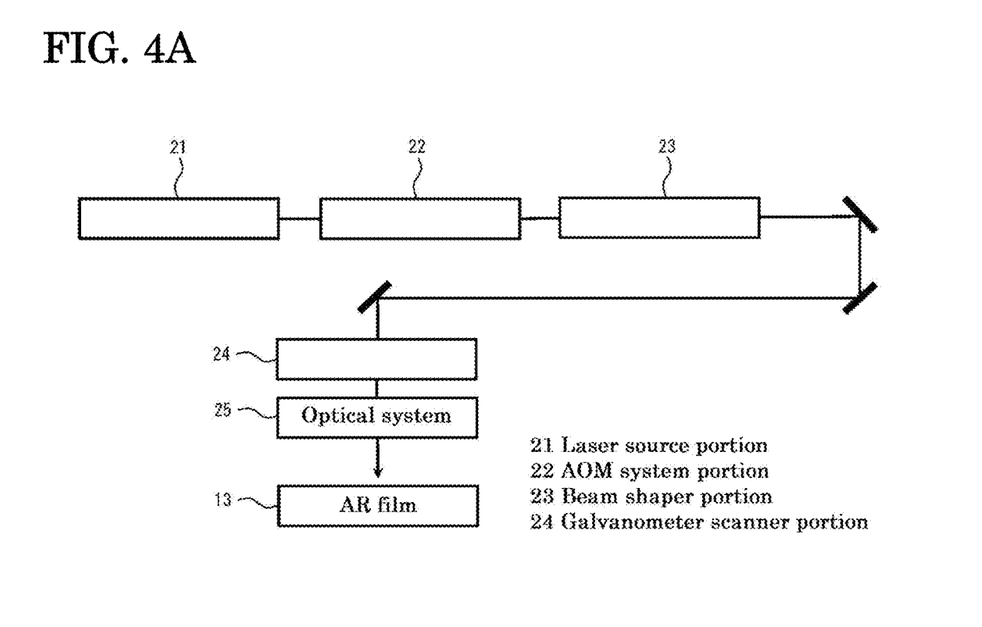
FIGS. 4A and 4B are diagrams illustrating a schematic configuration example of a laser processing apparatus used in a method for producing an eyeglass lens according to an embodiment of the present invention.
Figure 4B:
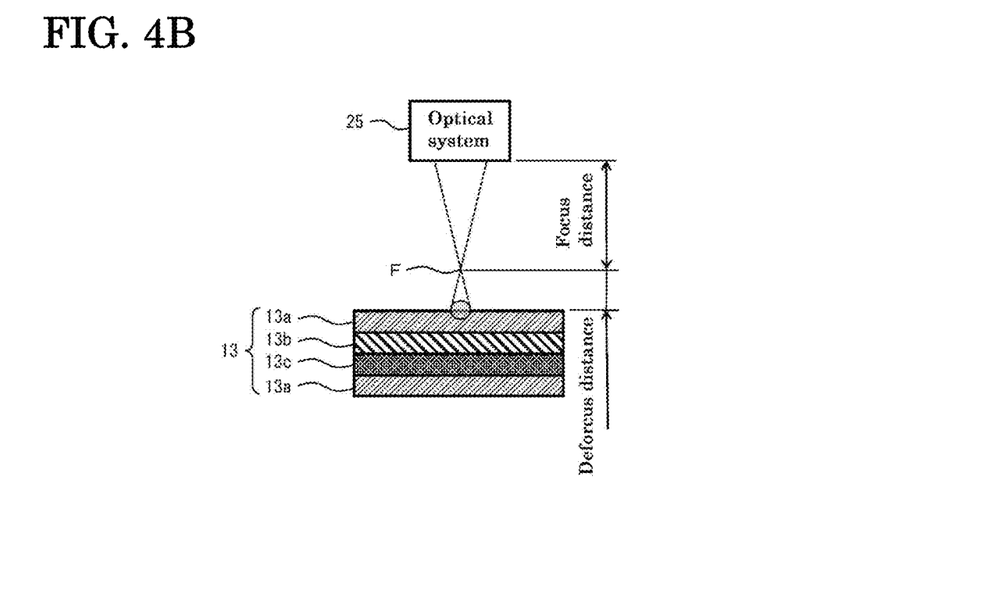

FIGS. 4A and 4B are diagrams illustrating a schematic configuration example of a laser processing apparatus used in a method for producing an eyeglass lens according to this embodiment.

As shown in FIG. 4A, the laser processing apparatus used in this embodiment includes a laser source portion 21, an AOM (Acousto Optics Modulator) system portion 22, a beam shaper portion 23, a galvanometer scanner portion 24, and an optical system 25, and is configured to irradiate the AR film 13 with a laser beam through these portions 21 to 25.

The laser source portion 21 emits a laser beam used for laser processing, and is configured to emit an ultrashort pulse laser beam.

In this embodiment, the ultrashort pulse laser beam refers to an ultrashort pulse laser beam having a pulse width of 0.1 picoseconds or more and less than 100 picoseconds, preferably refers to an ultrashort pulse laser beam having a pulse width of 0.1 picoseconds or more and 30 picoseconds or less, and more preferably refers to an ultrashort pulse laser beam having a pulse width of 0.1 picoseconds or more and 15 picoseconds or less. The lower limit of the pulse width is not particularly limited as long as it exceeds 0 femtoseconds, and as described above, an ultrashort pulse laser beam having a pulse width of 0.1 picoseconds or more (including 1 picoseconds or more) is suitably used, for example.

The wavelength of the ultrashort pulse laser beam is 355 nm due to THG (Third Harmonic Generation) or 532 nm due to SHG (Second Harmonic Generation), for example. However, there is no limitation thereto, and the wavelength thereof may be a basic wavelength of 1064 nm, or 266 nm due to FHG (Forth Harmonic Generation), for example. The ultrashort pulse laser beam has a pulse energy of 0.1 μJ or more and 30 μJ or less (up to about 60 μJ) at 50 kHz, for example. The ultrashort pulse laser beam has a beam diameter of 10 μm or more and 30 μm or less, for example.

A specific configuration of the laser source portion 21 is not particularly limited as long as such an ultrashort pulse laser beam can be emitted.

The AOM system portion 22 suppresses excessive irradiation with a laser beam that causes processing unevenness during laser processing by cancelling the output of the laser beam immediately after the galvanometer scanner portion 24 starts operation and just before the operation ends.

The beam shaper portion 23 can realize laser processing using a laser beam with a uniform energy distribution by converting the laser beam emitted from the laser source portion 21 from a Gaussian energy distribution to a top-hat energy distribution.

The galvanometer scanner portion 24 can realize scanning using a laser beam by two-dimensionally or three-dimensionally moving a position irradiated with the laser beam from the laser source portion 21, and thereby enables marking of a desired pattern through laser processing. Note that it is presumed that the range where the galvanometer scanner portion 24 can perform scanning using a laser beam (i.e., the maximum laser processing area) 4 is set to a size and a shape large enough to completely include the outer shape of an eyeglass lens to be processed (see FIG. 1).

The optical system 25 is configured by combining an optical lens such as a telecentric lens and a mirror, and guides a laser beam emitted from the laser source portion 21 such that the laser beam reaches a processed portion of the eyeglass lens.

Also, as shown in FIG. 4B, the laser processing apparatus used in this embodiment is configured to be able to irradiate the AR film 13 with a laser beam (i.e., an ultrashort pulse laser beam) through the optical system 25 and the like under a defocus setting. A defocus setting means that a focal position F of the laser beam with which a film is irradiated is set away from the surface of the AR film 13, which is a portion processed with the laser beam, by a predetermined defocus distance. If laser irradiation is performed under such a defocus setting, the beam energy can be distributed on the surface of the AR film 13 irradiated with the laser beam, thus realizing uniform film removal processing. In particular, this is very useful for a case where the height of an irradiated portion may change due to the influence of the surface shape of the AR film 13. However, the setting is not necessarily limited to the defocus setting, and laser irradiation may be performed under a focus setting in which the focal position F coincides with the surface of the AR film 13, or under an in-focus setting in which the focal position F is set away in a direction opposite to that under the defocus setting.

Next, a procedure of laser processing performed using a laser processing apparatus having the above-described configuration will be described.

When laser processing is performed, first, an eyeglass lens to be processed is set in the laser processing apparatus. At this time, the eyeglass lens is set such that an optical surface of the eyeglass lens, more specifically, the surface of the AR film 13 on this optical surface serves as a processing target surface. Although the optical surface to serve as the processing target surface may be either the object-side surface or the eyeball-side surface, it is presumed that the eyeball-side surface is a processing target surface in this embodiment, for example.

After the eyeglass lens is set, the laser source portion 21 and the galvanometer scanner portion 24 are made to operate based on pre-prepared pattern data (i.e., pattern data for specifying a decorative pattern). Accordingly, the processing area of the processing target surface of the eyeglass lens is irradiated with an ultrashort pulse laser beam in a pattern shape corresponding to the decorative pattern.

When the processing area is irradiated with the ultrashort pulse laser beam, the ultrashort pulse laser beam passes through the water repellent film 14 on the processing target surface of the eyeglass lens, and reaches the AR film 13 on the processing target surface. When the ultrashort pulse laser beam reaches the AR film 13, non-heating processing is performed on the AR film 13 because the ultrashort pulse laser beam is used.

Non-heating processing is also called ablation processing, for example, and is a technique for performing processing without heating utilizing a multiphoton absorption phenomenon of the ultrashort pulse laser beam. More specifically, non-heating processing is removal processing performed as a result of the influence of heat in the vicinity of the processing portion being suppressed as much as possible, and even if a material that melts only at considerably high temperatures under atmospheric pressure is used, a portion irradiated with a laser beam instantly melts, evaporates, and is dispersed. With such non-heating processing, the melted portion is instantly evaporated, dispersed, and removed, and thus the non-heating processing has little heat impact on the vicinity of the processing portion, and can be performed with reduced thermal impairment (deformation due to heat or the like).

When non-heating processing is performed through irradiation with an ultrashort pulse laser beam, the $SiO_2$ layer 13a, which is the outermost layer of the multilayer structure constituting the AR film 13, is partially removed from the AR film 13 in a pattern shape corresponding to the decorative pattern. Furthermore, the corresponding portion of the water repellent film 14 is also removed accompanying the removal of the $SiO_2$ layer 13a. Also, the $SnO_2$ layer 13b, which is located on the lower layer side of the $SiO_2$ layer 13a, is also partially removed accompanying the removal of the $SiO_2$ layer 13a. Accordingly, the $ZrO_2$ layer 13c located on the lower layer side of the $SnO_2$ layer 13b is exposed at the portion where the $SiO_2$ layer 13a has been removed. At this time, the $SnO_2$ layer 13b, which is a high refractive index layer on the upper layer side of the $ZrO_2$ layer 13c, may be removed together with the $SiO_2$ layer 13a, which is the outermost layer, as long as the $ZrO_2$ layer 13c serving as a high refractive index layer is exposed. If the removal of the $SnO_2$ layer 13b is allowed, the $SnO_2$ layer 13b can be formed to have a small thickness (e.g., about 5 nm).

Usually, heating processing in which a laser beam having a pulse width in the order of a nanosecond or more is widely used as laser processing for partially removing a thin film, instead of the above-described non-heating processing. In heating processing, the energy of the laser beam is absorbed by the processed portion of a thin film due to the relationship between the laser beam and the transmitting (absorbing) properties of the thin film, and thereby the thin film is removed. However, if such heating processing is applied to the AR film 13, each layer in the multilayer structure constituting the AR film 13 has laser beam absorbing properties, and thus, not only the outermost layer of the multilayer structure but also multiple layers including the outermost layer will be removed. Also, there is a risk that thermal impairment may occur in the vicinity of the removed processing portion. In particular, there is a concern that damage resulting from thermal impairment may remain on the surface of a lower layer that is to be exposed after removal.

In contrast, with non-heating processing described above, removal processing is performed using the effect of a pulse width rather than the effect of absorbing the energy of the laser beam, and thus it is possible to remove the $SiO_2$ layer 13a, which is the outermost layer of the multilayer structure constituting the AR film 13. Furthermore, it is possible to suppress thermal impairment because non-heating processing has little thermal impact on the vicinity of the processing portion. Specifically, if the $SiO_2$ layer 13a, which is the outermost layer of the AR film 13, is removed, for example, the $SnO_2$ layer 13b, which is the layer directly below the $SiO_2$ layer 13a, is also removed accompanying the removal of the $SiO_2$ layer 13a. As a result, the $ZrO_2$ layer 13c serving as a high refractive index layer is exposed, but it is possible to keep the exposed surface of the $ZrO_2$ layer 13c from being damaged.

By performing laser processing as described above, the $SiO_2$ layer 13a, which is the outermost layer of the AR film 13, is partially removed, and the $ZrO_2$ layer 13c serving as a high refractive index layer is exposed, and as a result, a decorative pattern is marked on the processing target surface of the eyeglass lens.

(3) Configuration of Eyeglass Lens

Next, a configuration of the eyeglass lens obtained using the production method with the above-described procedure, that is, the configuration of the eyeglass lens according to this embodiment, will be specifically described.

Figure 5A:
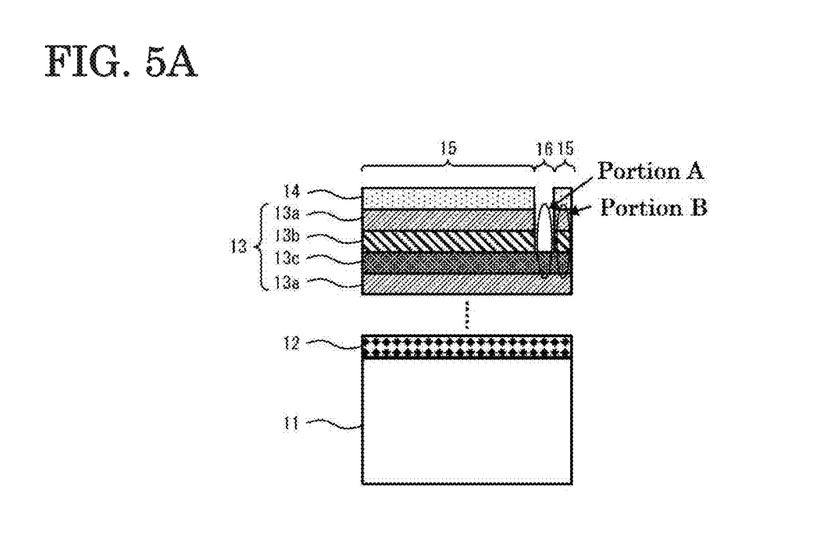
FIGS. 5A and 5B are diagrams illustrating a configuration example of main portions of an eyeglass lens according to an embodiment of the present invention.
Figure 5B:
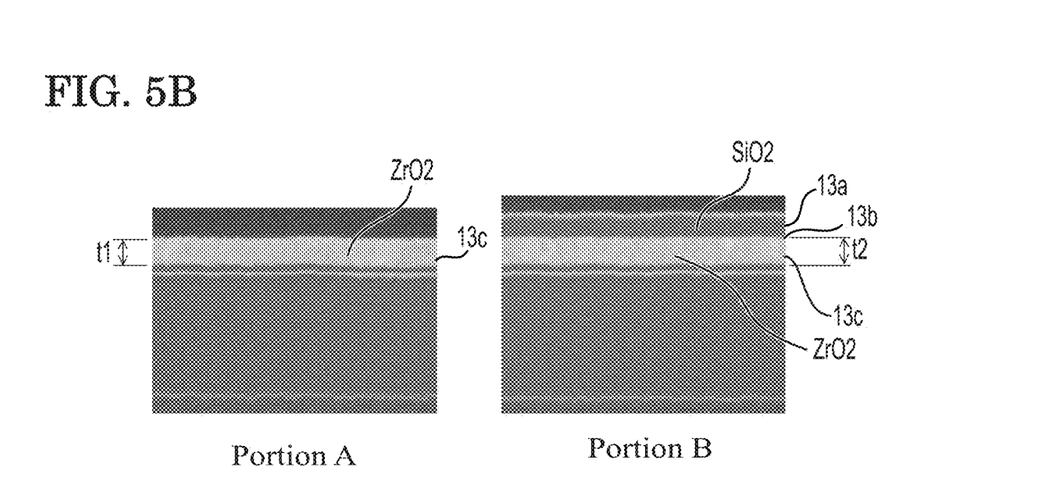

FIGS. 5A and 5B are diagrams illustrating a configuration example of main portions of the eyeglass lens according to this embodiment.

As shown in FIG. 5A, the eyeglass lens according to this embodiment is constituted by layering the HC film 12, the AR film 13, and the water repellent film 14 on the optical surface of the lens base member 11 in the stated order. Also, the AR film 13 has a multilayer structure in which the $SiO_2$ layer 13a, which is a low refractive index layer, and the $SnO_2$ layer 13b and the $ZrO_2$ layer 13c, which are high refractive index layers, are layered on each other, and the AR film 13 is formed such that the $ZrO_2$ layer 13c, which is a high refractive index layer, is exposed as a result of the $SiO_2$ layer 13a, which is the outermost layer of the multilayer structure, being partially removed. Accordingly, similarly to the $SiO_2$ layer 13a that is the outermost layer, the water repellent film 14 covering the AR film 13 and the $SnO_2$ layer 13b, which is the layer directly below the $SiO_2$ layer 13a, are also partially removed. That is, the eyeglass lens according to this embodiment is formed such that the optical surface of the lens base member 11 includes a non-processing region 15 covered with the HC film 12, the AR film 13, and the water repellent film 14, and a laser scan region (patterned region) 16 where the $SiO_2$ layer 13a, which is the outermost layer in the AR film 13, the $SnO_2$ layer 13b, which is the layer directly below the $SiO_2$ layer 13a, and the water repellent film 14 are partially removed so as to expose the $ZrO_2$ layer 13c, which is a high refractive index layer.

The light reflectance of the non-processing region 15 and the light reflectance of the laser scan region 16 are different from each other due to the presence or absence of the $SiO_2$ layer 13a because one of the non-processing region 15 and the laser scan region 16 is covered with the $SiO_2$ layer 13a, and the $ZrO_2$ layer 13c is exposed in the other. Therefore, when the appearance of the eyeglass lens is visually observed, the pattern shape formed by the laser scan region 16 can be visually recognized. That is, if the laser scan region 16 is formed in a pattern shape corresponding to a decorative pattern, the decorative pattern can be visually recognized. In this manner, the portion where the $SiO_2$ layer 13a, which is the outermost layer of the AR film 13, is removed can be used to form the decorative pattern. In order to make the pattern shape be visually recognizable as a decorative pattern, a high refractive index layer need only be exposed in the laser scan region 16 where the $SiO_2$ layer 13a is removed. Therefore, in the laser scan region 16, the $SnO_2$ layer 13b, which is a high refractive index layer on the upper layer side of the $ZrO_2$ layer 13c, may be removed together with the $SiO_2$ layer 13a, which is the outermost layer, as long as the $ZrO_2$ layer 13c serving as a high refractive index layer is exposed.

The laser scan region 16 constituting the decorative pattern is formed as a result of the $SiO_2$ layer 13a, which is the outermost layer of the AR film 13, and the $SnO_2$ layer 13b, which is the layer directly below the $SiO_2$ layer 13a, being removed. That is, target of removal is limited to the minimum layer including the $SiO_2$ layer 13a. Therefore, with regard to the layers of the multilayer structure constituting the AR film 13, it is possible to suppress separation caused by the formation of the laser scan region 16. If laser processing is performed utilizing laser beam absorbing properties, for example, not only the outermost layer of the multilayer structure but also multiple layers including the outermost layer are removed, and as the number of layers increases, that is, as the groove depth in the removed portion increases, a film is more likely to separate therefrom as the groove depth deepens. To address this, as in the laser scan region 16 in this embodiment, if the removed portion is limited to the minimum layer including the $SiO_2$ layer 13a, which is the outermost layer, the lower layer side is not affected at all, and thus it is possible to suppress film separation accompanying the formation of the removed portion.

As described above, removal of the $SiO_2$ layer 13a, which is the outermost layer of the AR film 13, can be realized through non-heating processing using irradiation with an ultrashort pulse laser beam. Such non-heating processing has little thermal impact on the vicinity of the processing portion, and it is possible to suppress thermal impairment. Therefore, in the laser scan region 16 constituting the decorative pattern, the $SnO_2$ layer 13b, which is the layer directly below the $SiO_2$ layer 13a, is also removed accompanying the removal of the $SiO_2$ layer 13a. As a result, the $ZrO_2$ layer 13c serving as a high refractive index layer is exposed, but it is possible to keep the exposed surface of the $ZrO_2$ layer 13c from being damaged.

If it is possible to keep the exposed surface of the $ZrO_2$ layer 13c from being damaged, it is also possible to suppress a decrease in the film thickness of the $ZrO_2$ layer 13c accompanying processing for removing the $SiO_2$ layer 13a. The film thicknesses of the $SiO_2$ layers 13a, the $SnO_2$ layer 13b, the $ZrO_2$ layer 13c, and the like can be specified by acquiring an electron microscope image of a cross-section of the AR film 13 and analyzing the acquired image.

FIG. 5B shows specific examples of the results of observation of a cross-section of the AR film 13 using an electron microscope. The examples in FIG. 5B show enlarged views of a portion A and a portion B shown in FIG. 5A, showing electron microscope images of the laser scan region 16 and the non-processing region 15. Note that, although the $SiO_2$ layer 13a, the $SnO_2$ layer 13b, and the $ZrO_2$ layer 13c are layered in the non-processing region 15, it is difficult to recognize the $SnO_2$ layer 13b in the images because the $SnO_2$ layer 13b has a small thickness (e.g., about 5 nm). On the other hand, the $SiO_2$ layer 13a and the $SnO_2$ layer 13b are removed in the laser scan region 16, and as a result, the $ZrO_2$ layer 13c is exposed.

According to the electron microscope images shown in FIG. 5B, it is found that, in the $ZrO_2$ layer 13c to be exposed through removal of the $SiO_2$ layer 13a, there is no significant difference between a thickness t1 of a portion in the laser scan region 16 where the $SiO_2$ layer 13a is removed and a thickness t2 of a portion in the non-processing region 15 covered with the $SiO_2$ layer 13a. More specifically, a ratio t1/t2 between the thickness t1 of the portion where the $SiO_2$ layer 13a is removed and the thickness t2 of the portion where the $SiO_2$ layer 13a is not removed belongs to a range of 0.90 or more and 1.00 or less, preferably a range of 0.95 or more and 1.00 or less, and more preferably 0.99 or more and 1.00 or less.

With the $ZrO_2$ layer 13c, which is a high refractive index layer to be exposed, the amount of a decrease in the film thickness thereof accompanying the processing for removing the $SiO_2$ layer 13a is suppressed in this manner such that the film thickness does not decrease, or even if the film thickness decreases, the decrease amount is extremely small. This is because the laser scan region 16 is formed through non-heating processing using irradiation with an ultrashort pulse laser beam, without damaging the $ZrO_2$ layer 13c, which is a lower layer. This means that, if the thickness ratio t1/t2 of the $ZrO_2$ layer 13c to be exposed belongs to the above-described range, it can be presumed that the laser scan region 16 is formed without the $ZrO_2$ layer 13c being damaged, and the formation of the laser scan region 16 is performed using non-heating processing with the use of an ultrashort pulse laser beam.

According to the eyeglass lens formed in the above-described manner, even if the decorative pattern is marked on the eyeglass lens, it is possible to suppress separation of the layers constituting the AR film 13 in the multilayer structure without damaging the $ZrO_2$ layer 13c to be exposed. Therefore, even if this technique is applied to eyeglass lens products, a decorative pattern can be marked on the eyeglass lenses without degrading the quality of the products.

(4) Effects of this Embodiment

According to this embodiment, one or more effects described below can be obtained.

(a) In this embodiment, a decorative pattern is marked on an eyeglass lens by partially removing the $SiO_2$ layer 13a, which is the outermost layer of the AR film 13, from the AR film 13, which is one of thin films covering an optical surface of the lens base member 11, so as to expose the $ZrO_2$ layer 13c, which is a high refractive index layer. If only the minimum layer including the $SiO_2$ layer 13a, which is the outermost layer of the AR film 13, is removed, it is possible to suppress separation of the layers in the multilayer structure constituting the AR film 13 caused by the removal of the $SiO_2$ layer 13a.

(b) In this embodiment, a decorative pattern is marked on an eyeglass lens by partially removing the $SiO_2$ layer 13a, which is the outermost layer of the AR film 13, by performing non-heating processing through irradiation with an ultrashort pulse laser beam, so as to expose the $ZrO_2$ layer 13c, which is a high refractive index layer. With such non-heating processing, removal processing is performed due to the effect of a pulse width rather than the effect of absorbing the energy of the laser beam, and thus it is possible to remove the minimum layer including the $SiO_2$ layer 13a, which is the outermost layer of the AR film 13. Furthermore, because non-heating processing is performed, it is possible to suppress thermal impairment in the vicinity of a processing portion, and thus to keep the exposed surface of the $ZrO_2$ layer 13c, which is to be exposed through removal of the $SiO_2$ layer 13a, from being damaged.

(c) As described above, in this embodiment, a decorative pattern is marked on an eyeglass lens by removing the $SiO_2$ layer 13a, which is the outermost layer of the AR film 13, using an ultrashort pulse laser beam, so as to expose the $ZrO_2$ layer 13c, which is a high refractive index layer. Therefore, according to this embodiment, it is possible to suppress separation of layers of the AR film 13 without damaging the $ZrO_2$ layer 13c to be exposed, and thus, even if this technique is applied to eyeglass lens products, a decorative pattern can be marked on the eyeglass lenses without degrading the quality of the products.

(d) In this embodiment, the ultrashort pulse laser beam has a pulse width of 0.1 picoseconds or more and less than 100 picoseconds, preferably has a pulse width of 0.1 picoseconds or more and 30 picoseconds or less, and more preferably has a pulse width of 0.1 picoseconds or more and 15 picoseconds or less. It is possible to reliably perform non-heating processing with such a pulse width. That is, the $SiO_2$ layer 13a is removed due to the effect of the pulse width rather than the effect of absorbing the energy of the laser beam, and as a result, the above-described effects can be reliably obtained.

(e) In this embodiment, when non-heating processing is performed through irradiation with an ultrashort pulse laser beam, the AR film 13 is irradiated with the ultrashort pulse laser beam under a defocus setting. By irradiating the AR film 13 with a laser beam under such a defocus setting, the beam energy can be distributed on the surface of the AR film 13 irradiated with the laser beam, and as a result, uniform film removal processing can be performed. This is very useful for cases where the height of the irradiated portion may change due to the influence of the surface shape of the AR film 13 in particular.

(f) In this embodiment, non-heating processing is performed through irradiation with an ultrashort pulse laser beam, and thus it is possible to keep the exposed surface of the $ZrO_2$ layer 13c serving as a high refractive index layer, which is to be exposed through removal of the $SiO_2$ layer 13a, from being damaged. Therefore, with the $ZrO_2$ layer 13c, it is possible to suppress a decrease in the film thickness thereof accompanying processing for removing the $SiO_2$ layer 13a. Specifically, if the $SiO_2$ layer 13a is partially removed and the $SnO_2$ layer 13b is also removed accompanying the partial removal of the $SiO_2$ layer 13a, the ratio t1/t2 between the thickness t1 of the $ZrO_2$ layer 13c in the removed portion where the $SiO_2$ layer 13a and the $SnO_2$ layer 13b are removed and the thickness t2 of the $ZrO_2$ layer 13c in the non-removed portion belongs to a range of 0.90 or more and 1.00 or less, preferably a range of 0.95 or more and 1.00 or less, and more preferably a range of 0.99 or more and 1.00 or less. With the $ZrO_2$ layer 13c, the amount of a decrease in the film thickness thereof accompanying the processing for removing the $SiO_2$ layer 13a is suppressed in this manner such that the film thickness does not decrease, or even if the film thickness decreases, the decrease amount is extremely small. Therefore, this technique is very preferably applied to eyeglass lens products when a decorative pattern is to be marked on the eyeglass lenses without degrading the quality of the products.

(5) Variations and the Like

Although an embodiment of the present invention was described above, the disclosed content described above indicates an exemplary embodiment of the present invention. That is to say, the technical scope of the present invention is not limited to the above-described exemplary embodiment, and various modifications can be made without departing from the gist thereof.

Although a case where an optical member is an eyeglass lens has been described as an example in the above-described embodiment, the present invention is not limited thereto. That is, the present invention is applicable to optical members other than eyeglass lenses in exactly the same manner.

Although a case where a decorative pattern is marked through non-heating processing using an ultrashort pulse laser beam has been described as an example in the above-described embodiment, the present invention is not limited thereto. That is, non-heating processing using an ultrashort pulse laser beam is also applicable in exactly the same manner to patterns other than decorative patterns to be marked as long as any kind of patterning is performed on an optical surface of an optical member.

Although a case has been described as an example where the outermost layer of the AR film 13 is the $SiO_2$ layer 13a serving as a low refractive index layer, layers on the lower side of the $SiO_2$ layer 13a are the $SnO_2$ layer 13b and the $ZrO_2$ layer 13c serving as high refractive index layers, and when the $SiO_2$ layer 13a is partially removed, the $SnO_2$ layer 13b is also removed accompanying the partial removal of the $SiO_2$ layer 13a, and as a result, the $ZrO_2$ layer 13c serving as a high refractive index layer is exposed, the present invention is not limited thereto. The AR film 13 may be formed by layering layers other than the $SiO_2$ layer 13a, the $SnO_2$ layer 13b, and the $ZrO_2$ layer 13c on each other. Also, the outermost layer of the AR film 13 may be a layer other than the $SiO_2$ layer 13a as long as it is a low refractive index layer. The same applies to a layer on the lower side thereof, and the lower layer may be a layer other than the $SnO_2$ layer 13b or the $ZrO_2$ layer 13c as long as it is a high refractive index layer. The $SnO_2$ layer 13b to be removed together with the $SiO_2$ layer 13a may be a thin conductive ITO layer, instead of the $SnO_2$ layer 13b.

A case where the $SiO_2$ layer 13a, which is the outermost layer of the AR film 13, and the $SnO_2$ layer 13b, which is the layer directly below the $SiO_2$ layer 13a, are removed through non-heating processing using an ultrashort pulse laser beam has been described as an example in the above-described embodiment. Accordingly, as described above, the effect of being able to suppress film separation can be obtained. Non-heating processing using an ultrashort pulse laser can realize removal of multiple layers including the outermost layer in this manner. Even if multiple layers including the outermost layer are removed, with non-heating processing using an ultrashort pulse laser, it is possible to suppress damage to the exposed surface of a layer to be exposed through removal, and thus to suppress a decrease in the film thickness thereof accompanying removal processing. That is, even if multiple layers including the outermost layer are removed, with regard to the layer directly below the removed layer, the ratio t1/t2 between the thickness t1 of the removed portion and the thickness t2 of the non-removed portion belongs to a range of 0.90 or more and 1.00 or less, preferably a range of 0.95 or more and 1.00 or less, and more preferably 0.99 or more and 1.00 or less. This means that this disclosure encompasses the following inventive concepts.

That is, according to this disclosure, an optical member includes:
an optical base member having an optical surface; and
an antireflection film covering the optical surface of the optical base member;

in which the antireflection film has a multilayer structure, and is formed as a result of at least one layer constituting the multilayer structure being partially removed, and
a layer directly below the at least one layer is formed such that a ratio t1/t2 between a thickness t1 of a removed portion of the at least one layer and a thickness t2 of a non-removed portion of the at least one layer belongs to a range of 0.90 or more and 1.00 or less.

LIST OF REFERENCE NUMERALS

1 Eyeglass lens (optical member)
2 Frame shape
3 Decorative pattern
4 Scannable range
11 Lens base member (optical base member)
12 HC film
13 AR film
13a $SiO_2$ layer (low refractive index layer)
13b $SnO_2$ layer (high refractive index layer)
13c $ZrO_2$ layer (high refractive index layer)
14 Water repellent film
15 Non-processing region
16 Laser scan region (patterned region)
21 Laser source portion
22 AOM system portion
23 Beam shaper portion
24 Galvanometer scanner portion
25 Optical system

What is claimed is:

1. A method for producing an optical member, the method comprising:
removing a portion of a low refractive index layer, which is the outermost layer of a multilayer structure,
wherein the low refractive index layer and a high refractive index layer are layered on each other; and
removing the portion of the low refractive index layer by performing non-heating processing on an antireflection film that is formed to cover an optical surface of an optical base member and has the multilayer structure, through irradiation with an ultrashort pulse laser beam so as to expose the high refractive index layer,
wherein the ultrashort pulse laser beam has a pulse width of less than 100 picoseconds, and
wherein, in the high refractive index layer that is exposed through removal of the low refractive index layer, a ratio t1/t2 between a thickness t1 of a removed portion of the low refractive index layer and a thickness t2 of a non-removed portion of the low refractive index layer is in a range of 0.90 or more and 1.00 or less.

2. The method for producing an optical member according to claim 1,
wherein the pulse width of the ultrashort pulse laser beam is 0.1 picoseconds or more and less than 100 picoseconds.

3. The method for producing an optical member according to claim 1,
wherein the antireflection film is irradiated with the ultrashort pulse laser beam under a defocus setting.

4. The method for producing an optical member according to claim 1,
wherein the outermost layer is a $SiO_2$ layer serving as the low refractive index layer, and
a layer that is exposed through removal of the low refractive index layer is a $ZrO_2$ layer serving as the high refractive index layer.

5. The method for producing an optical member according to claim 1,
wherein the optical member is an eyeglass lens.

6. The method for producing an optical member according to claim 1,
wherein a predefined marking pattern of the optical member is formed by removing the portion the low refractive index layer of the outermost layer.

7. An optical member comprising:
an optical base member having an optical surface; and
an antireflection film covering the optical surface of the optical base member,
wherein the antireflection film comprises a multilayer structure in which a low refractive index layer and a high refractive index layer are layered on each other, and is formed such that the high refractive index layer is exposed as a result of a portion of the low refractive index layer of the outermost layer in the multilayer structure being removed, and
wherein, in the high refractive index layer that is exposed through removal of the low refractive index layer, a ratio t1/t2 between a thickness t1 of a removed portion of the low refractive index layer and a thickness t2 of a non-removed portion of the low refractive index layer is in a range of 0.90 or more and 1.00 or less.

8. The optical member according to claim 7,
wherein the outermost layer is a $SiO_2$ layer serving as the low refractive index layer, and
a layer that is exposed through removal of the low refractive index layer is a $ZrO_2$ layer serving as the high refractive index layer.

9. The optical member according to claim 7,
wherein the optical member is an eyeglass lens.

10. The optical member according to claim 7,
wherein a removed portion of the low refractive index layer of the outermost layer constitutes a predefined marking pattern of the optical member.

11. The method for producing an optical member according to claim 1,
wherein the ultrashort pulse laser beam has wavelength of 355 nm, 532 nm or 1064 nm.

12. The method for producing an optical member according to claim 1,
wherein the ultrashort pulse laser beam has a pulse width of less than 30 picoseconds.

13. The method for producing an optical member according to claim 1,
wherein the ultrashort pulse laser beam has a pulse width of less than 15 picoseconds.

14. The method for producing an optical member according to claim 1, further comprising:
prior removing the portion of a low refractive index layer, measuring a three-dimensional shape of an area of a processing target surface.

15. The method for producing an optical member according to claim 1, further comprising:
irradiating the ultrashort pulse laser beam with three-dimensional scanning based on pre-prepared pattern data.

16. The method for producing an optical member according to claim 15,
wherein irradiation of the ultrashort pulse laser beam is performed with a galvanometer scanner.

17. The method for producing an optical member according to claim 1,
wherein a processed region in which the low refractive index layer is removed and a non-processed region in which processing is not performed have different light reflectance so that a pattern formed by a laser scan is visible.

18. The optical member according to claim 7,
wherein a region in which the high refractive index layer is exposed has a light reflectance different from a region in which the low refractive index layer is not removed, so that a formed pattern is visible.

19. The optical member according to claim 7,
wherein the high refractive index layer which is exposed comprises $ZrO_2$.

20. The optical member according to claim 7,
wherein the low refractive index layer comprises $SiO_2$.

21. The optical member according to claim 7,
wherein the antireflection film comprises a conductive layer, the conductive layer comprising $SiO_2$ or ITO.

* * * * *